(12) United States Patent
Liu

(10) Patent No.: US 11,231,445 B2
(45) Date of Patent: Jan. 25, 2022

(54) SENSOR CHIP

(71) Applicants: Kabushiki Kaisha Toshiba, Tokyo (JP); Toshiba Electronic Devices & Storage Corporation, Tokyo (JP)

(72) Inventor: Jia Liu, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 365 days.

(21) Appl. No.: 16/518,071

(22) Filed: Jul. 22, 2019

(65) Prior Publication Data

US 2020/0292585 A1 Sep. 17, 2020

(30) Foreign Application Priority Data

Mar. 13, 2019 (JP) .............................. JP2019-046399

(51) Int. Cl.
*G01R 15/20* (2006.01)
*H01F 17/00* (2006.01)
*H05K 1/18* (2006.01)
*H01F 27/29* (2006.01)

(52) U.S. Cl.
CPC ....... *G01R 15/207* (2013.01); *H01F 17/0013* (2013.01); *H01F 27/292* (2013.01); *H05K 1/181* (2013.01); *H05K 2201/1003* (2013.01)

(58) Field of Classification Search
CPC .................................................. G01R 15/207
USPC ....................................................... 324/117 R
See application file for complete search history.

(56) References Cited

U.S. PATENT DOCUMENTS

| 2005/0242959 | A1* | 11/2005 | Watanabe | ................. H01Q 7/00 340/572.7 |
| 2009/0219027 | A1* | 9/2009 | Morrison | ................ G01V 3/104 324/326 |
| 2011/0170647 | A1* | 7/2011 | Bussard | .................... H05H 1/16 376/129 |
| 2018/0006214 | A1 | 1/2018 | Nakamura | |
| 2019/0187222 | A1* | 6/2019 | Amit | .................. G01R 33/0005 |
| 2021/0241961 | A1* | 8/2021 | Ludwig | .............. G01R 33/0017 |

FOREIGN PATENT DOCUMENTS

| JP | 2017-083280 A | 5/2017 |
| JP | 6263819 B2 | 1/2018 |
| JP | 6267613 B2 | 1/2018 |

* cited by examiner

*Primary Examiner* — Stanley Tso
(74) *Attorney, Agent, or Firm* — Allen & Overy LLP

(57) ABSTRACT

Provided is a sensor chip including: a board; a three-dimensional object provided on the board, the three-dimensional object being a cuboid or a cube having a first surface and a second surface facing the first surface and including an insulating material; a first coil provided on the first surface; a second coil provided on the second surface, the second coil being electrically connected to the first coil; and a magnetic measurement element provided in the three-dimensional object. Directions of magnetic fields generated in the first coil and the second coil by current for electrically conducting the first coil and the second coil are the same.

12 Claims, 5 Drawing Sheets

SENSOR CHIP

CROSS-REFERENCE TO RELATED APPLICATION

This application is based upon and claims the benefit of priority from Japanese Patent Application No. 2019-046399, filed on Mar. 13, 2019, the entire contents of which are incorporated herein by reference.

FIELD

Embodiments described herein relate generally to a sensor chip.

BACKGROUND

A sensor chip (current detection device) detects a magnetic field generated by a current flowing in a coil by using a magnetosensitive portion such as a Hall element. For example, in the case of detecting the magnetic field by a Hall element, the sensor chip converts the intensity of the current flowing in the coil into a voltage.

In order to obtain a high magnetic field strength, two coils are disposed opposite to each other, and a magnetic measurement element is disposed between the two coils.

DETAILED DESCRIPTION

Figure 1A:
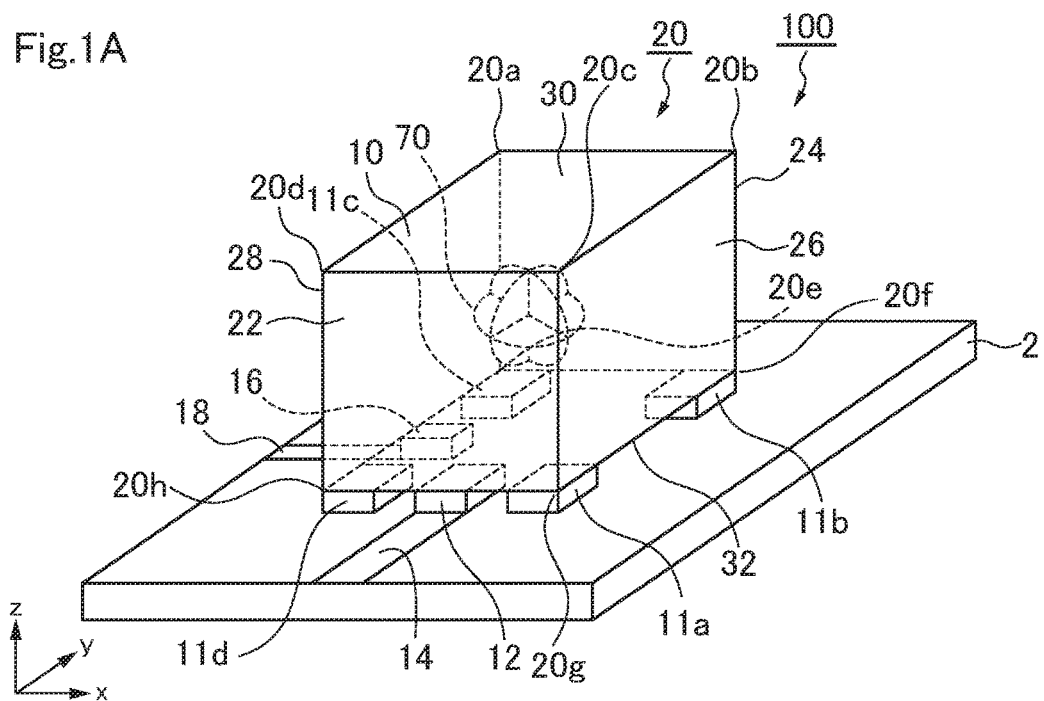
FIGS. 1A to 1F are schematic views of a sensor chip according to a first embodiment.
Figure 1B:
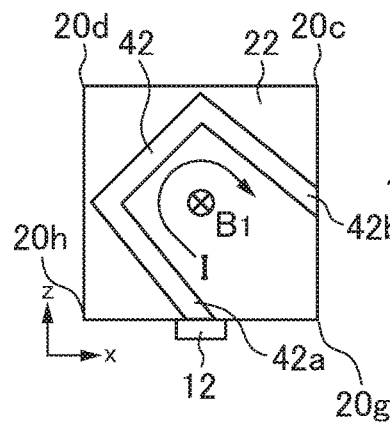
Figure 1C:
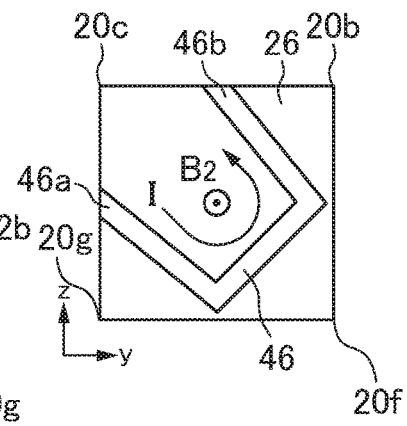
Figure 1D:
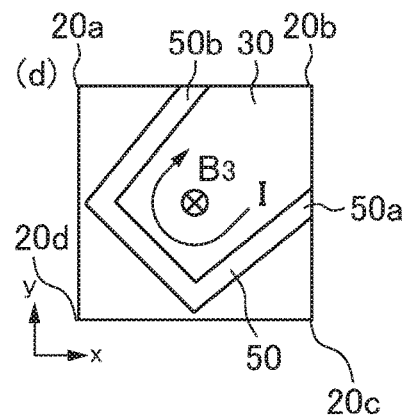
Figure 1E:
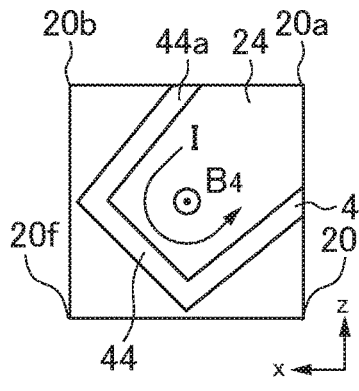
Figure 1F:
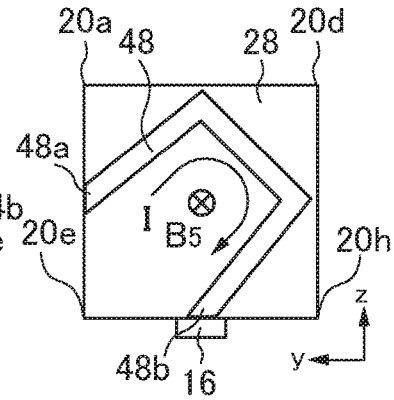

A sensor chip according to an embodiment includes: a board; a three-dimensional object provided on the board, the three-dimensional object being a cuboid or a cube having a first surface and a second surface facing the first surface and including an insulating material; a first coil provided on the first surface; a second coil provided on the second surface, the second coil being electrically connected to the first coil; and a magnetic measurement element provided in the three-dimensional object, wherein directions of magnetic fields generated in the first coil and the second coil by current for electrically conducting the first coil and the second coil are the same.

Hereinafter, embodiments will be described with reference to the drawings. In the drawings, the same or similar components are denoted by the same or similar reference numerals.

In the present specification, the same or similar members will be denoted by the same reference numerals, and redundant descriptions may be omitted.

In the present specification, in order to indicate the positional relationship of parts and the like, the upper direction of the drawing is described as "upper" and the lower direction of the drawing as "lower". In the present specification, the terms "upper" and "lower" are not necessarily terms indicating the relationship with the direction of gravity.

First Embodiment

A sensor chip according to an present embodiment includes: a board; a three-dimensional object provided on the board, the three-dimensional object being a cuboid or a cube having a first surface and a second surface facing the first surface and including an insulating material; a first coil provided on the first surface; a second coil provided on the second surface, the second coil being electrically connected to the first coil; and a magnetic measurement element provided in the three-dimensional object, wherein directions of magnetic fields generated in the first coil and the second coil by current for electrically conducting the first coil and the second coil are the same.

FIGS. 1A to 1F are schematic views of a sensor chip 100 according to the present embodiment. Herein, in order to understand the structure, an insulating material 10 is illustrated as being transparent.

FIG. 1A is a schematic view of the sensor chip 100 according to the present embodiment. Herein, in order to understand the structure, a first coil 42, a second coil 44, a third coil 46, a fourth coil 48, and a fifth coil 50 described later are omitted in illustration.

A board 2 is a plate-shaped member that is formed by using, for example, an epoxy resin, a melamine derivative, a liquid crystal polymer, a polyphenylene ether (PPE) resin, a fluorocarbon resin, a phenol resin, a polyaminobismaleimide (PABM) resin, or the like. However, the material of the board 2 is not limited to those described above. In addition, for example, the board 2 is a multilayer board, but the board is not limited to this, and may be a single-layer board.

Herein, an x-axis, a y-axis perpendicular to the x-axis, and a z-axis perpendicular to the x-axis and the y-axis are defined. A front surface of the board 2 is assumed to be disposed in parallel to the xy plane. In addition, the x direction parallel to the x-axis is an example of a first direction, the y direction parallel to the y-axis is an example of a second direction, and the z direction parallel to the z-axis is an example of a third direction.

Wires 14 and 18 are wires provided on the front surface of the board 2.

A connection portion 12 and a connection portion 16 electrically connect the wire 14 and the wire 18 of the board 2 to the sensor chip. The connection portions 12 and 16 are, for example, solder balls but are not limited to the solder balls.

A three-dimensional object 20 is provided on the board 2. The three-dimensional object 20 has a cuboidal shape. In addition, the three-dimensional object 20 more preferably has a cubic shape. The three-dimensional object 20 has a first surface 22, a second surface 24 facing the first surface, a third surface 26, a fourth surface 28 facing the third surface 26, a fifth surface 30, and a sixth surface 32 facing the fifth surface 30. For example, the first surface 22 and the second surface 24 are disposed in parallel (perpendicular to the y direction) to the xz plane. The third surface 26 and the fourth surface 28 are disposed in parallel (perpendicular to the x direction) to the yz plane. The fifth surface 30 and the sixth surface 32 are disposed in parallel (perpendicular to the z direction) to the xy plane. For example, the first surface 22 is a surface located in the front, the second surface 24 is a surface located in the back, the third surface 26 is a right surface, and the fourth surface 28 is a left surface, the fifth surface 30 is a top surface, and the sixth surface 32 is a bottom surface. In addition, as vertices of the three-dimensional object 20, vertices 20a, 20b, 20c, 20d, 20e, 20f, 20g, and 20h are illustrated in FIGS. 1A to 1F.

The three-dimensional object 20 includes an insulating material 10. Herein, the insulating material 10 is, for example, a known material that can constitute the sensor chip, such as a thermosetting epoxy resin, a ceramic material, or an epoxy resin containing filler made of silicon oxide, aluminum oxide.

FIGS. 1B to 1F are schematic views the first coil 42, the third coil 46, the fifth coil 50, the second coil 44, and the fourth coil 48 on the first surface 22, the third surface 26, the fifth surface 30, the second surface 24, and the fourth surface 28, respectively.

Each of the first coil 42, the second coil 44, the third coil 46, the fourth coil 48, and the fifth coil 50 has a U shape and is a coil formed with a wire containing a conductive material such as copper (Cu). In addition, the first coil 42, the second coil 44, the third coil 46, the fourth coil 48, and the fifth coil 50 may be formed by attaching a patch or the like made of Cu on the front surface of the three-dimensional object 20.

The first coil 42 is provided on the first surface 22. One end 42a of the first coil 42 is connected to the connection portion 12. The other end 42b of the first coil 42 is electrically connected to the third coil 46 provided on the third surface 26.

One end 46a of the third coil 46 is connected to the other end 42b of the first coil 42. The other end 46b of the third coil 46 is electrically connected to the fifth coil 50 provided on the fifth surface 30.

One end 50a of the fifth coil 50 is connected to the other end 46b of the third coil 46. The other end 50b of the fifth coil 50 is electrically connected to the second coil 44 provided on the second surface 24.

One end 44a of the second coil 44 is connected to the other end 50b of the fifth coil 50. The other end 44b of the second coil 44 is electrically connected to a fourth coil 48 provided on the fourth surface 28.

One end 48a of the fourth coil 48 is electrically connected to the other end 44b of the second coil 44. The other end 48b of the fourth coil 48 is electrically connected to the connection portion 16.

A current source (not illustrated) is connected to the wire 14 and the wire 18, and a current to be measured from the current source is flowed from the wire 14 through the first coil 42, the third coil 46, the fifth coil 50, the second coil 44, and the fourth coil 48 to the wire 18. In this case, in the first surface 22 illustrated in FIG. 1B, a magnetic field $B_1$ directed toward the back side of the drawing sheet (a magnetic field $B_y$ in the three-dimensional object 20 illustrated in FIG. 1A directed toward the back side of the drawing sheet) is generated. In the third surface 26 illustrated in FIG. 1C, a magnetic field $B_2$ directed toward the front side of the drawing sheet (a magnetic field $B_2$ in the three-dimensional object 20 illustrated in FIG. 1A directed from the left toward the right in the drawing sheet) is generated. In the fifth surface 30 illustrated in FIG. 1D, a magnetic field $B_3$ directed toward the back side of the drawing sheet (a magnetic field $B_3$ in the three-dimensional object 20 illustrated in FIG. 1A directed downward from the top of the drawing sheet) is generated. In the second surface 24 illustrated in FIG. 1E, a magnetic field $B_4$ directed toward the front side of the drawing sheet (a magnetic field in the three-dimensional object 20 illustrated in FIG. 1A directed toward the back side of the drawing sheet) is generated. In the fourth surface 28 illustrated in FIG. 1F, a magnetic field $B_5$ directed toward the back side of the drawing sheet (a magnetic field in the three-dimensional object 20 illustrated in FIG. 1A directed from the left toward the right in the drawing sheet) is generated.

Since the magnetic field B: and the magnetic field $B_4$ have the same direction, the magnetic fields reinforce each other. In addition, since the magnetic field $B_2$ and the magnetic field $B_5$ have the same direction, the magnetic fields reinforce each other.

A magnetic measurement element 70 is provided inside the three-dimensional object 20. The magnetic measurement element 70 is, for example, a Hall element. As a Hall element, a Hall element using a gallium arsenide (GaAs) material having good temperature characteristics is preferable. For example, a Hall element using indium antimonide (InSb) or indium arsenide (InAs) may be used. In addition, the magnetic measurement element 70 is not limited to the Hall element, but the magnetic measurement element 70 may be, for example, a magnetoresistance effect element such as a giant magnetoresistance effect element, an anisotropic magnetoresistance effect element, or a tunnel magnetoresistance effect element.

An insulating layer using an inorganic insulating material such as silicon oxide ($SiO_x$) or silicon nitride ($SiN_x$) or a protective layer using an organic thin film material such as polyimide may be provided inside the sensor chip 100.

The sensor chip 100 is connected to the board 2 by solder connection, copper plating, or the like by using terminal portions 11a, 11b, 11c, and 11d. Terminal portions 11a, 11b, 11c, and 11d contain a known electric conduction material such as copper (Cu). In addition, the terminal portions 11a, 11b, 11c, and 11d may contain a plurality of conductive materials.

Figure 2:
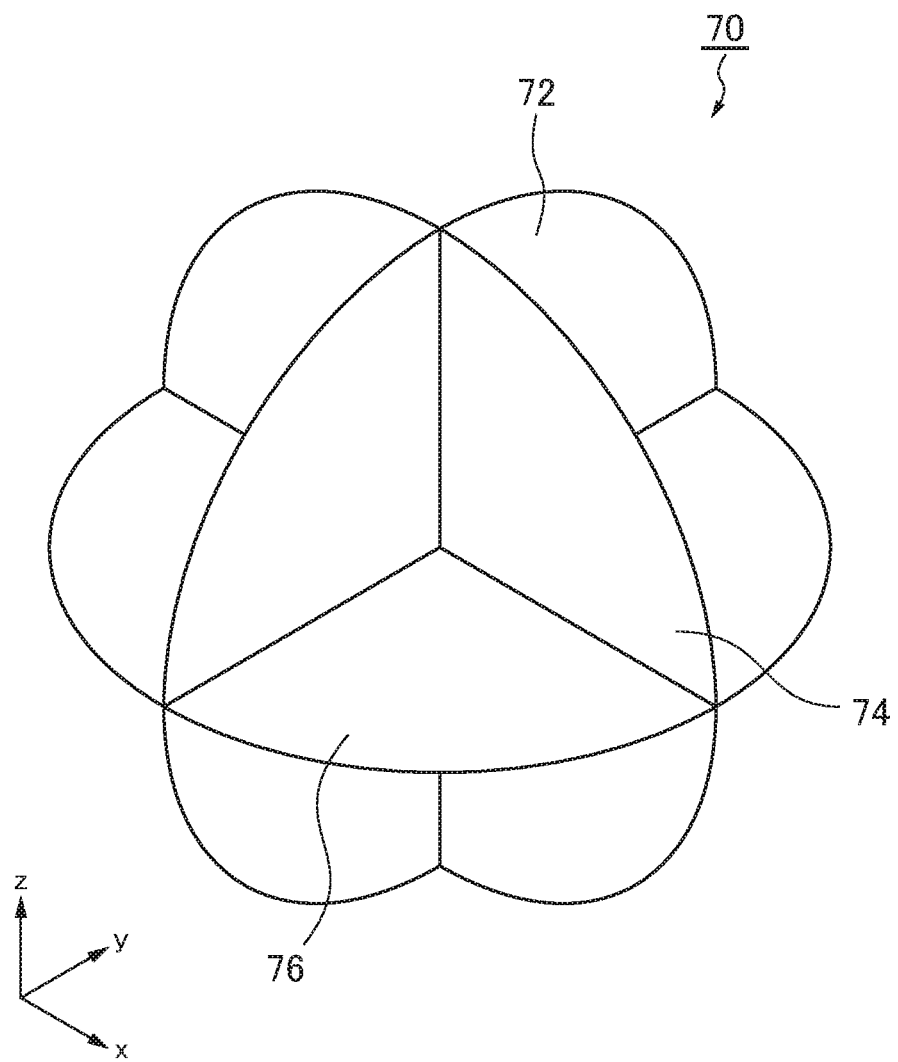
FIG. 2 is a schematic view of a magnetic measurement element of the first embodiment.

FIG. 2 is a schematic view of the magnetic measurement element 70 of the present embodiment. The magnetic measurement element 70 includes a first magnetosensitive portion 72 that detects a magnetic flux in the x direction, a second magnetosensitive portion 74 that detects a magnetic flux in the y direction, and a third magnetosensitive portion 76 that detects a magnetic flux in the z direction.

The first magnetosensitive portion 72, the second magnetosensitive portion 74, and the third magnetosensitive portion 76 are, for example, Hall elements. The first magnetosensitive portion 72, the second magnetosensitive portion 74, and the third magnetosensitive portion 76 are connected to the wire on the board 2 (not illustrated) by the wire in the three-dimensional object 20 (not illustrated). Then, a voltage generated in the Hall element is measured, and the magnetic field strength is measured from the measured voltage. In addition, the first magnetosensitive portion 72, the second magnetosensitive portion 74, and the third magnetosensitive portion 76 are not limited to Hall elements, but the magnetosensitive portions may be, for example, magnetoresistance effect elements such as giant magnetoresistance effect elements, anisotropic magnetoresistance effect elements, or tunnel magnetoresistance effect elements.

The first magnetosensitive portion 72 measures the magnetic field $B_2$ and the magnetic field $B_5$. The second magnetosensitive portion 74 measures the magnetic field $B_1$ and the magnetic field $B_4$. The third magnetosensitive portion 76 measures the magnetic field $B_3$.

Figure 3A:
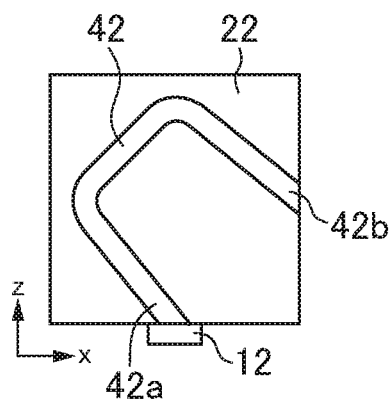
FIGS. 3A and 3B are schematic views of a coil in another aspect of the first embodiment.
Figure 3B:
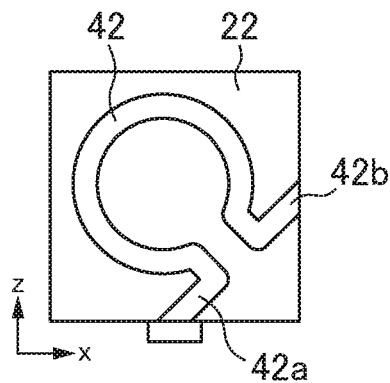

FIGS. 3A and 3B are schematic views of a coil in another aspect of the present embodiment. It is preferable that a wire forming the first coil 42 has no corners (FIG. 3A). This is because the corners cause reflections and losses in a case where the frequency of the current is particularly increased. In addition, it is preferable that a wire forming the first coil 42 is formed so as to surround the area as small as possible (FIG. 3B). This is to increase the magnetic field strength (magnetic flux density) generated by the first coil 42. In addition, the same applies to the second coil 44, the third coil 46, the fourth coil 48, and the fifth coil 50.

Next, applications of the sensor chip 100 according to the present embodiment will be described. The sensor chip 100 according to the present embodiment is used for current detection. For example, a driving circuit (not illustrated) of the magnetic measurement element 70 and an amplifier (not illustrated) are provided around the sensor chip 100. The driving circuit supplies, for example, an operating voltage of the magnetic measurement element 70 to operate the magnetic measurement element 70. In addition, the driving circuit supplies, for example, an operating voltage of the amplifier to operate the amplifier. For example, in a case where the magnetic measurement element 70 is a Hall element, a voltage generated by the magnetic field measured by the Hall element is measured after being amplified by the amplifier and is converted to a current. In this manner, the current can be measured by the sensor chip 100. The sensor chip 100 according to the present embodiment is used for an AC/DC adapter, a control device for a general-purpose inverter or a variable motor speed device, overcurrent protection of a power module, and the like.

It is preferable that the sensor chip according to the present embodiment is formed by a Molded Interconnect Device (MID) method. However, the manufacturing method is not limited to this.

Next, the functions and effects of the present embodiment will be described.

In a case where the current is small, with respect to the magnetic field detected by the Hall element or the like, a desired voltage value may not be obtained by the Hall element. As a countermeasure to this case, inputting a large amount of current to the sensor chip, using an amplifier for amplifying a voltage, or increasing an amplification factor of an amplifier is considered. However, in a case where a large amount of current is input to the sensor chip, there is a problem in that the sensor chip itself generates heat. In addition, in a case where the heat generation is particularly large, there is a problem in that the wire forming the coil is disconnected. In a case where the amplifier is used, there is a problem in that noise generated from the amplifier itself is mixed into the amplified voltage. In addition, in a case where the amplification factor of the amplifier is increased, there is also a problem in that noise from other circuits is mixed into the amplified voltage.

Figure 4A:
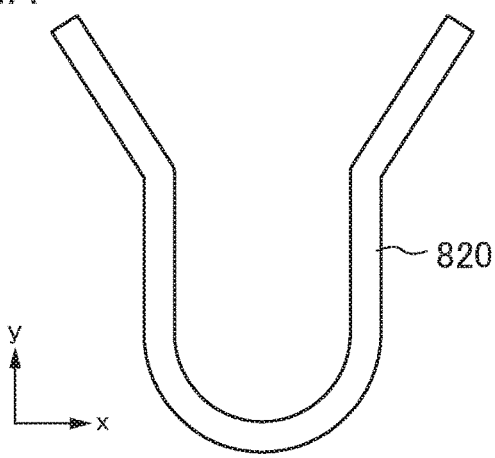
FIGS. 4A and 4B are schematic views of a sensor chip according to Comparative Example of the first embodiment.
Figure 4B:
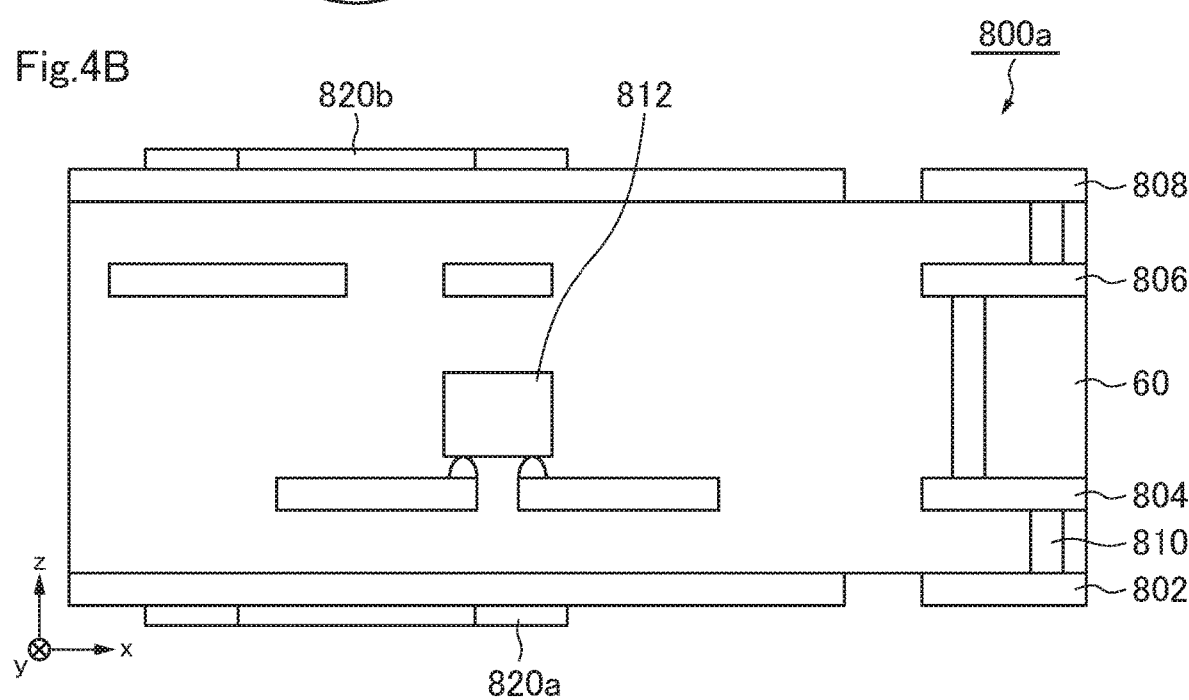
Figure 5A:
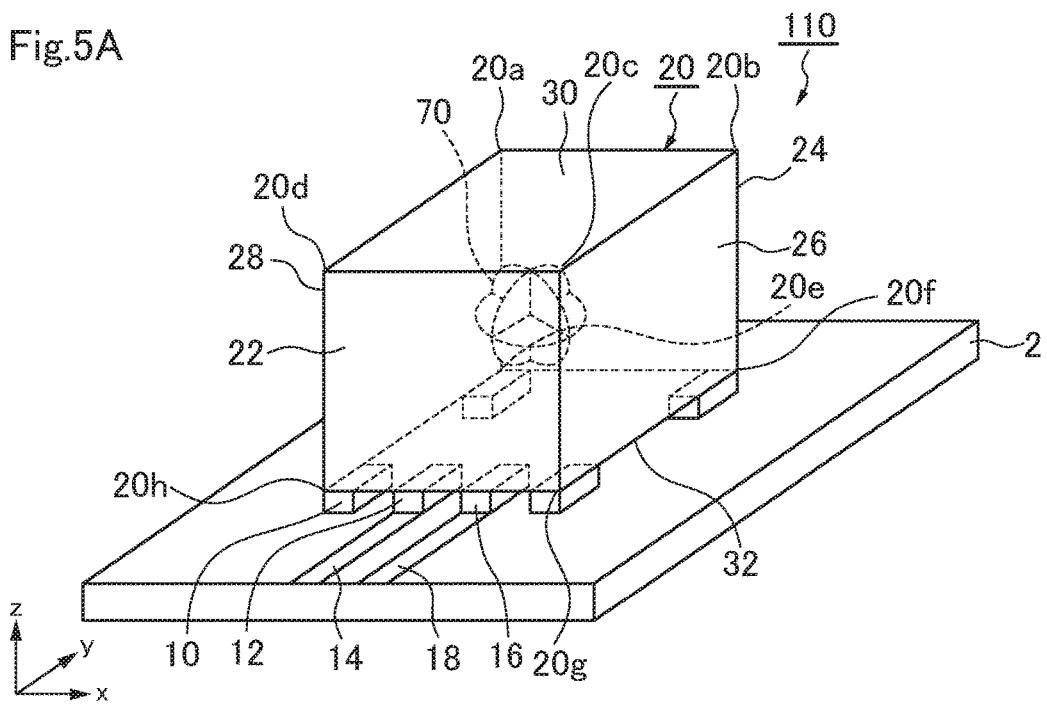
FIGS. 5A to 5G are schematic views of a sensor chip according to a second embodiment.
Figure 5B:
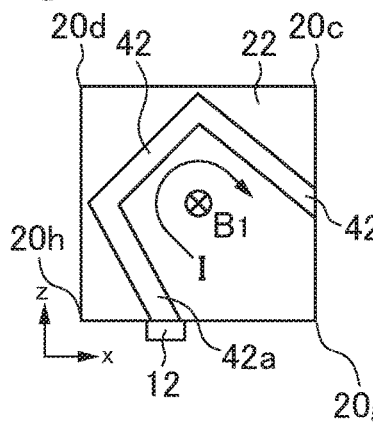
Figure 5C:
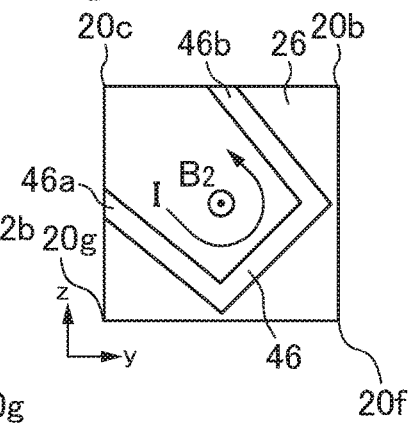
Figure 5D:
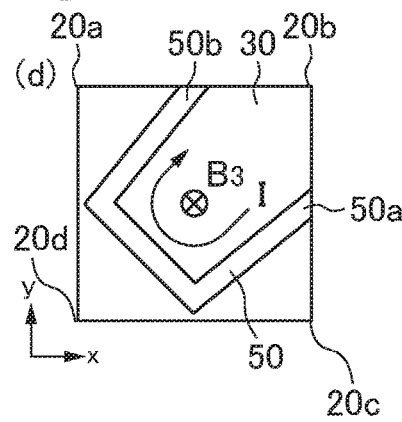
Figure 5E:
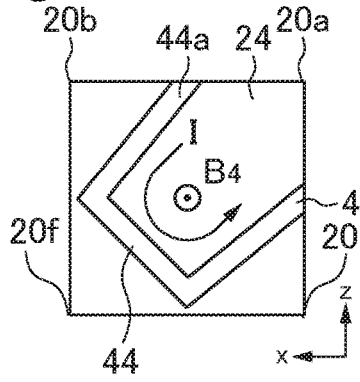
Figure 5F:
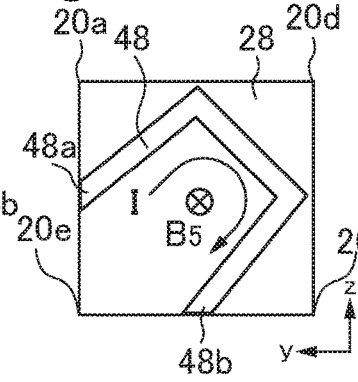
Figure 5G:
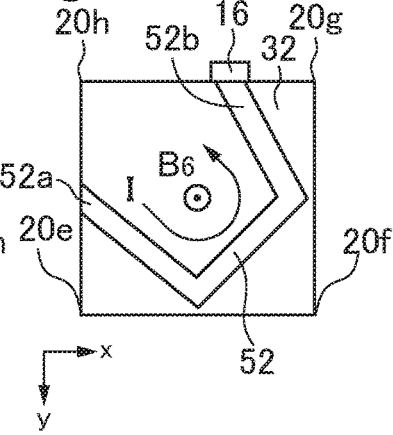

FIGS. 4A and 4B are schematic views of a sensor chip according to Comparative Example of the present embodiment. FIG. 4A illustrates a top view of a coil 820 used in Comparative Example. The coil 820 is a one-turn coil having a planar shape. FIG. 4B is a schematic side view of a sensor chip 800a according to Comparative Example using the coil 820 illustrated in FIG. 3A. In addition, in order to understand the structure, the interlayer insulating film 60 is illustrated as being transparent. A coil 820a as the coil 820 is provided on the front surface of a first board 802. In addition, a coil 820b as the coil 820 is provided on the front surface of a fourth board 808. The magnetic measurement element 812 is provided on a second board 804. The first board 802, the second board 804, a third board 806, and the fourth board 808 are sequentially stacked, and electrical connection between the respective boards is made by the connection conductor 810. When a current to be measured flows in the coil 820a and the coil 820b, a magnetic field is generated in the vertical direction of the drawing sheet. The current is measured by measuring the magnetic field by using the magnetic measurement element 812.

However, the magnetic field is generated in the vertical direction of the drawing sheet. For this reason, the second board 804 having a wire connected to the magnetic measurement element 812 is prepared, and after the magnetic measurement element 812 is mounted on the second board 804, the magnetic measurement element 812 is provided between the coil 820a and the coil 820b. This is to obtain a high magnetic flux and to detect a larger magnetic flux by the magnetic measurement element 812. Then, the number of layers of the board increases, and thus, there is a problem in that it is difficult to reduce the size, so that the sensor chip becomes expensive.

According to the sensor chip according to the present embodiment, the coils are formed on the respective surfaces of the three-dimensional object 20 to generate the magnetic fields, and the generated magnetic fields are detected by the magnetic measurement element 70. Accordingly in the case of, for example, the sensor chip 100, the magnetic field strength that is to be five times can be obtained by the first to fifth coils, so that it is possible to obtain a highly sensitive sensor chip.

In addition, unlike the sensor chip according to Comparative Example as illustrated in FIGS. 4A and 4B, no board is provided inside the three-dimensional object 20. For this reason, it is easy to reduce the size. Furthermore, the sensor chip 100 according to the present embodiment can be surface-mounted on the board 2 as illustrated in FIGS. 1A to 1F. For this reason, the configuration is simple.

In case where the three-dimensional object 20 has a cubic shape, the symmetry of the magnetic fields generated on the respective surfaces is improved, and thus, cancellation of the magnetic fields is less likely to occur, so that it is possible to obtain a sensor chip with higher sensitivity.

Herein, the magnetic flux density B measured by the magnetic measurement element 70 is calculated by $B=\Phi/S$. $\Phi$ is the total magnetic flux generated by the coil, and S is the area of the magnetosensitive portion of the magnetic measurement element 70. In addition, there is a relationship $\Phi=L_I \times I$. Herein, $L_I$ is the self-inductance of the coil, and I is the current flowing in the coil. In addition, in general, the combined inductance L of the two coils has a relationship of $L=L_A+L_B+2M$. Herein, $L_A$ is the self-inductance of one coil, $L_B$ is the self-inductance of the other coil, and 2M is the mutual inductance between the two coils. For this reason, as the three-dimensional object 20 becomes smaller, the distance between the respective coils decreases, and thus, the mutual inductance increases. As a result, the measured magnetic flux density increases.

In addition, when a coil is formed around the three-dimensional object 20 having a cuboidal shape as in the sensor chip 100 according to the present embodiment, L is increased, and thus, it is considered that R of the coil is increased as a whole. However, the magnetic field strength observed by the magnetic measurement element 70 is considered to be five times as described above. Therefore, it is considered that, even if the current I flowing in the coil is set to be ⅕ times, the same magnetic field strength can be obtained. Then, since the amount of heat generation per second by flowing the current is calculated by $RI^2$, it is estimated that the heat generation is $5 \times (1/5)^2 = 1/5$. Therefore, the sensor chip according to the present embodiment is advantageous also from the viewpoint of suppression of the heat generation.

According to the sensor chip according to the present embodiment, it is possible to provide a highly sensitive sensor chip.

Second Embodiment

A sensor chip according to the present embodiment is different from the sensor chip according to the first embodiment in that a sixth coil 52 is provided on a sixth surface 32. Herein, the same points as those of the first embodiment are omitted in description.

FIGS. 5A to 5G are schematic views of the sensor chip 110 according to the present embodiment.

The sixth coil 52 is provided on the sixth surface 32. The other end 48b of the fourth coil 48 is electrically connected to one end 52a of the sixth coil 52. The other end 52b of the sixth coil 52 is electrically connected to the wire 18 through the connection portion 16. When a current flows in the sixth coil 52, a magnetic field $B_6$ directed toward the front side of the drawing sheet (a magnetic field $B_6$ in the three-dimensional object 20 illustrated in FIG. 5A directed downward from top of the drawing sheet) is generated. Since the magnetic field $B_6$ and the magnetic field $B_3$ reinforce each other, a stronger magnetic field is detected by the third magnetosensitive portion 76. In other words, since the magnetic field strength that is to be six times can be obtained by the first to sixth coils, it is possible to provide a highly sensitive sensor chip.

According to the sensor chip according to the present embodiment, it is possible to provide a highly sensitive sensor chip.

While certain embodiments have been described, these embodiments have been presented by way of example only, and are not intended to limit the scope of the inventions. Indeed, sensor chips described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A sensor chip comprising:
a board;
a three-dimensional object provided on the board, the three-dimensional object being a cuboid or a cube having a first surface and a second surface facing the first surface and including an insulating material;
a first coil provided on the first surface;
a second coil provided on the second surface, the second coil being electrically connected to the first coil; and
a magnetic measurement element provided in the three-dimensional object,
wherein directions of magnetic fields generated in the first coil and the second coil by current for electrically conducting the first coil and the second coil are the same.

2. The sensor chip according to claim 1,
wherein the three-dimensional object further has a third surface and a fourth surface facing the third surface, and
wherein the sensor chip further comprises:
a third coil provided on the third surface to be connected to the first coil and the second coil; and
a fourth coil provided on the fourth surface, the fourth coil being electrically connected to the first coil, the second coil, and the third coil,
wherein a direction of a magnetic field generated in the third coil by current for electrically conducting the first coil, the second coil, the third coil, and the fourth coil is the same as a direction of a magnetic field generated in the fourth coil.

3. The sensor chip according to claim 2,
wherein the three-dimensional object further has a fifth surface, and
wherein the sensor chip further comprises a fifth coil provided on the fifth surface and electrically connected to the first coil, the second coil, the third coil, and the fourth coil.

4. The sensor chip according to claim 3,
wherein the three-dimensional object further has a sixth surface facing the fifth surface,
wherein the sensor chip further comprises a sixth coil provided on the sixth side, the sixth coil being electrically connected to the first coil, the second coil, the third coil, the fourth coil, and the fifth coil, and
wherein a direction of a magnetic field generated in the fifth coil by current for electrically conducting the first coil, the second coil, the third coil, the fourth coil, the fifth coil, and the sixth coil is the same as a direction of a magnetic field generated in the sixth coil.

5. The sensor chip according to claim 3,
wherein the magnetic measurement element includes:
a first magnetosensitive portion detecting a magnetic flux in a first direction;
a second magnetosensitive portion detecting a magnetic flux in a second direction intersecting the first direction; and
a third magnetosensitive portion detecting a magnetic flux in a third direction intersecting the first direction and the second direction.

6. The sensor chip according to claim 5,
wherein the first direction is perpendicular to the first surface,
wherein the second direction is perpendicular to the third surface, and
wherein the third direction is perpendicular to the fifth surface.

7. A sensor chip comprising:
a three-dimensional object being a cuboid or a cube having a first surface and a second surface facing the first surface and including an insulating material;
a first coil provided on the first surface;
a second coil provided on the second surface, the second coil being electrically connected to the first coil; and
a magnetic measurement element provided in the three-dimensional object,
wherein directions of magnetic fields generated in the first coil and the second coil by current for electrically conducting the first coil and the second coil are the same.

8. The sensor chip according to claim 7,
wherein the three-dimensional object further has a third surface and a fourth surface facing the third surface, and
wherein the sensor chip further comprises:
a third coil provided on the third surface and connected to the first coil and the second coil; and
a fourth coil provided on the fourth surface, the fourth coil being electrically connected to the first coil, the second coil, and the third coil;

wherein a direction of a magnetic field generated in the third coil by current for electrically conducting the first coil, the second coil, the third coil, and the fourth coil is the same as a direction of a magnetic field generated in the fourth coil.

9. The sensor chip according to claim 8,
wherein the three-dimensional object further has a fifth surface, and
wherein the sensor chip further comprises a fifth coil provided on the fifth surface and electrically connected to the first coil, the second coil, the third coil, and the fourth coil.

10. The sensor chip according to claim 9,
wherein the three-dimensional object further has a sixth surface facing the fifth surface,
wherein the sensor chip further comprises a sixth coil provided on the sixth side, the sixth coil being electrically connected to the first coil, the second coil, the third coil, the fourth coil, and the fifth coil;
and wherein a direction of a magnetic field generated in the fifth coil by current for electrically conducting the first coil, the second coil, the third coil, the fourth coil, the fifth coil, and the sixth coil is the same as a direction of a magnetic field generated in the sixth coil.

11. The sensor chip according to claim 9,
wherein the magnetic measurement element includes:
 a first magnetosensitive portion detecting a magnetic flux in a first direction;
 a second magnetosensitive portion detecting a magnetic flux in a second direction intersecting the first direction; and
 a third magnetosensitive portion detecting a magnetic flux in a third direction intersecting the first direction and the second direction.

12. The sensor chip according to claim 11,
wherein the first direction is perpendicular to the first surface,
wherein the second direction is perpendicular to the third surface, and
wherein the third direction is perpendicular to the fifth surface.

* * * * *